United States Patent
Chen

(10) Patent No.: US 9,412,672 B2
(45) Date of Patent: Aug. 9, 2016

(54) IN SITU ETCH COMPENSATE PROCESS

(71) Applicant: Taiwan Semiconductor Manufacturing Company, Ltd., Hsin-Chu (TW)

(72) Inventor: Ko-Feng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/302,647

(22) Filed: Jun. 12, 2014

(65) Prior Publication Data

US 2015/0364385 A1 Dec. 17, 2015

(51) Int. Cl.
*H01L 21/66* (2006.01)
*H01L 21/308* (2006.01)

(52) U.S. Cl.
CPC ............ *H01L 22/20* (2013.01); *H01L 21/3086* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 7,208,407 B2* | 4/2007 | Lindsay et al. | ............... | 438/637 |
| 7,306,746 B2* | 12/2007 | Chen et al. | ............ | 216/59 |
| 8,435,419 B2* | 5/2013 | Ding et al. | ............ | 216/75 |

* cited by examiner

*Primary Examiner* — Robert Carpenter
(74) *Attorney, Agent, or Firm* — Slater Matsil, LLP

(57) ABSTRACT

A method includes performing an etching on a mask layer to form an opening in the mask layer. The mask layer is a part of a wafer. The method further includes measuring a lateral size of the opening, comparing the lateral size of the opening with a specified range, and performing a compensation etch to compensate for a difference between the lateral size and the specified range. After the compensation etch, a target layer of the wafer is etched to extend the opening into the target layer.

17 Claims, 8 Drawing Sheets

IN SITU ETCH COMPENSATE PROCESS

BACKGROUND

The manufacturing of integrated circuits typically includes multiple photolithography processes. When the dimensions of the integrated circuits become increasingly smaller, the requirement for controlling the critical dimensions of the integrated circuits is also increasingly tightened. The critical dimensions are the minimum width of gate electrodes of the transistors in the wafer. The critical dimensions may be used as a reference for forming metal layers.

In conventional processes for controlling the critical dimensions (which is essentially controlling the sizes of the formed features), a photo resist is applied on a wafer. The photo resist is exposed using a photolithography mask, which includes opaque patterns and transparent patterns. The photo resist is then patterned through development. The patterned photo resist is then used to etch an underlying hard mask. The wafer is then sent to a metrology tool, which measures the sizes of the patterns in the hard mask. The measured sizes are compared to the specified ranges, which specify the desirable ranges of features to be formed. Hence, it can be determined whether the measured sizes are greater than, smaller than, or equal to, the specified ranges. The determined information is then feedback to the etching of the hard mask in the next wafer in order to adjust the sizes of the features in the next wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
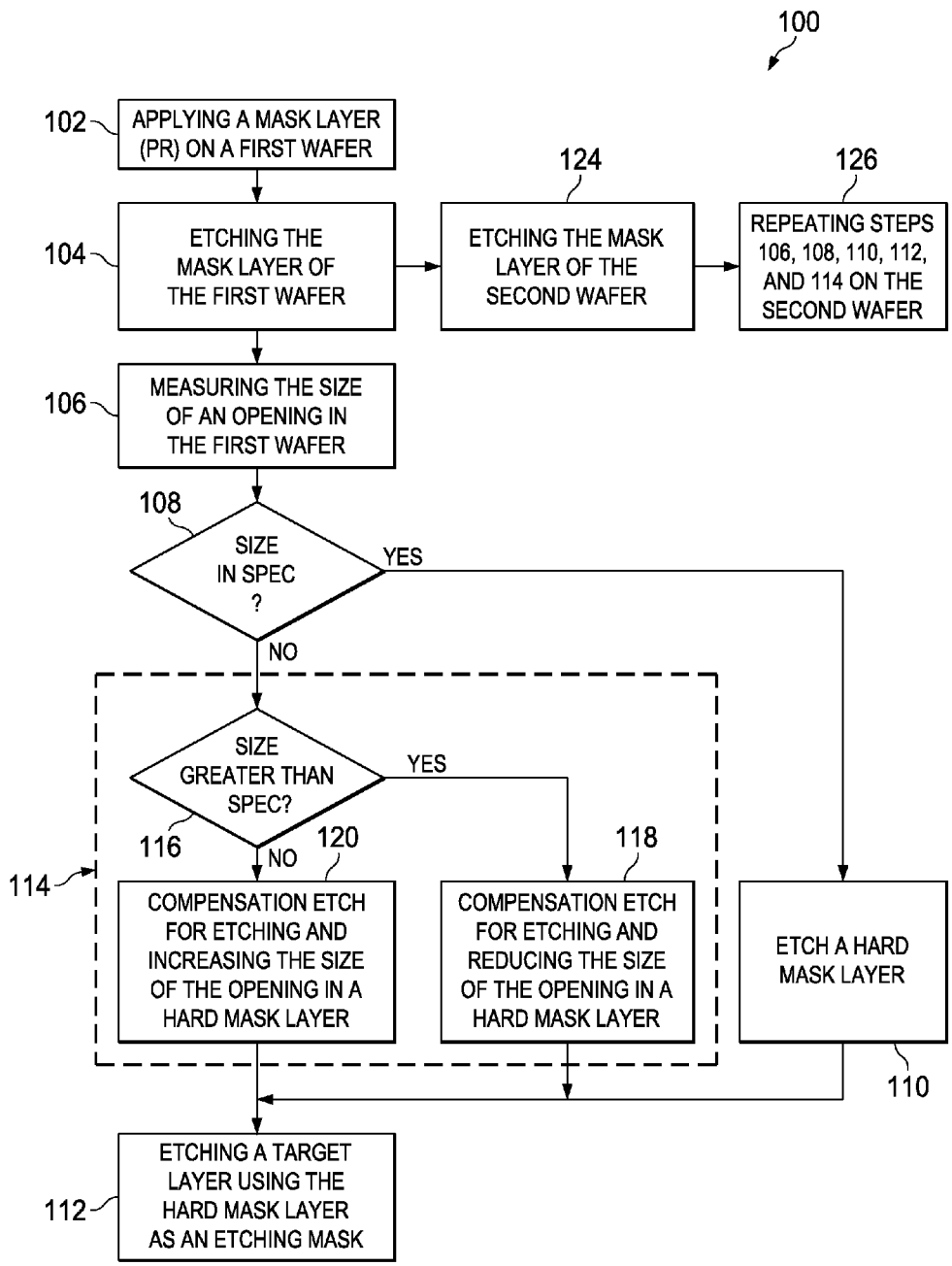
FIG. 1 illustrates a process flow for controlling the sizes of integrated circuit features through etching and in-situ measurement in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of controlling the sizes of integrated circuits in etching processes is provided in accordance with various exemplary embodiments. The intermediate stages of forming the patterns are illustrated. The variations of the embodiments are discussed. Throughout the various views and illustrative embodiments, like reference numbers are used to designate like elements.

FIG. 1 illustrates process flow 100 for the formation of an integrated circuit structure, wherein the process flow adopts an in-situ size (and critical dimension) controlling method in accordance with the embodiments of the present application. Furthermore, the in-situ size controlling method in accordance with the embodiments of the present disclosure is discussed referring to FIGS. 3 through 11, which illustrate the cross-sectional views of intermediate stages in the formation of trenches and metal lines in the trenches.

Figure 3:
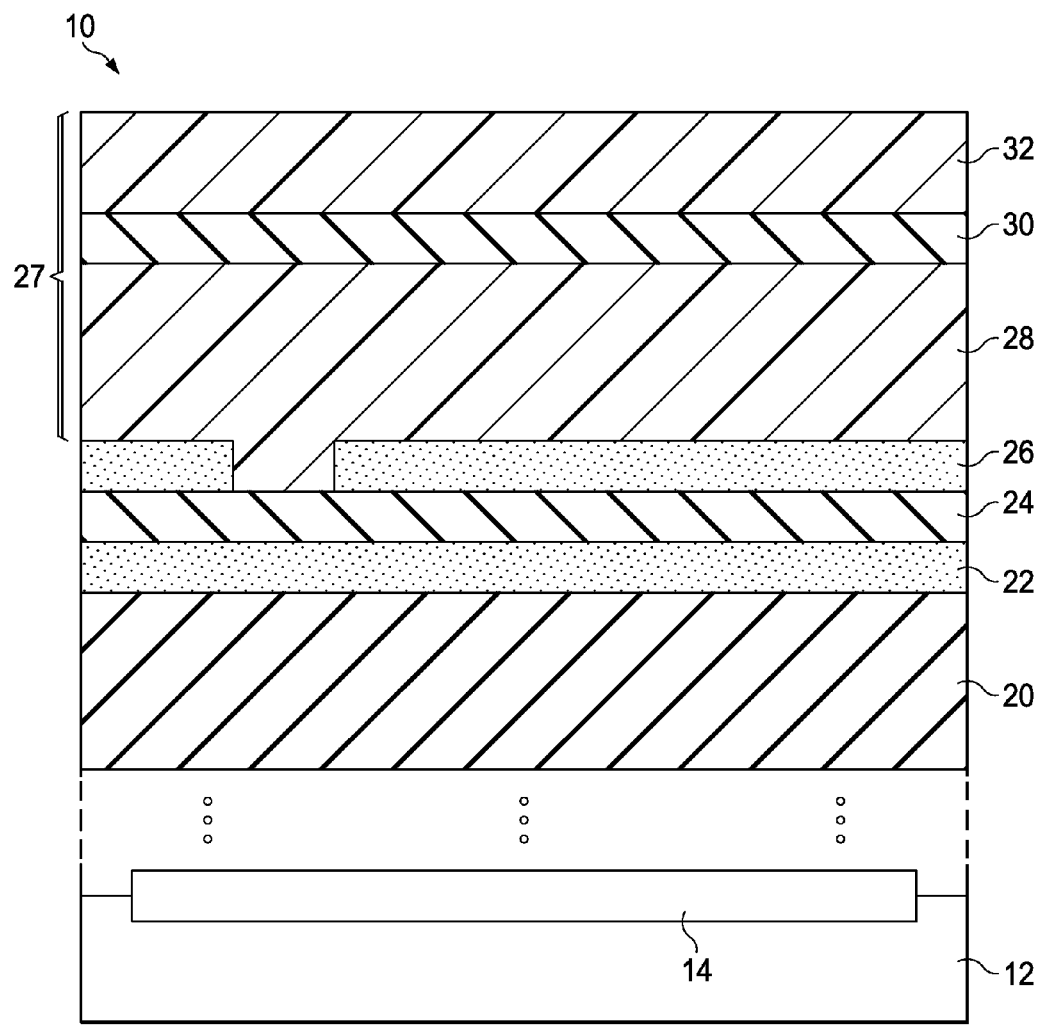
FIGS. 3 through 11 are cross-sectional views of intermediate stages in an etching process, wherein in-situ etching and measurement are performed in accordance with some embodiments.

Referring to FIG. 3, an initial structure is provided. The initial structure may be an intermediate structure of an integrated circuit manufacturing process. In accordance with some embodiments of the present disclosure, the initial structure includes wafer 10, which includes layer 20 therein. Layer 20 is the target layer that is to be etched in subsequent processes. In some embodiments, target layer 20 is a dielectric layer, which may include a low-k dielectric material, an oxide (such as silicon oxide), a nitride (such as silicon nitride), an oxynitride (such as silicon oxynitride), multi-layers thereof, and/or combinations thereof. In these embodiments, wafer 10 may include a plurality of layers under layer 20. For example, as illustrated in FIG. 3, wafer 10 may include semiconductor substrate 12, which may include crystalline silicon, crystalline silicon germanium, a crystalline III-V compound semiconductor, or other applicable semiconductor materials. Integrated circuit devices such as transistors 14 may be formed at a surface of semiconductor substrate 14.

It is noted that target layer 20 may be one of various types of layers, on which lithography processes are to be performed. For example, in alternative embodiments, target layer 20 includes a metal layer, which may include copper, aluminum, tungsten, nickel, titanium, tantalum, multi-layers thereof, and/or alloys thereof. In yet other embodiments, target layer 20 is a semiconductor substrate, which may be formed of a semiconductor material such as silicon, silicon germanium, silicon carbon, a III-V compound semiconductor, or the like, and may be a bulk substrate or a Semiconductor-On-Insulator (SOI) substrate. Hence, the method discussed referring to the embodiments of the present disclosure may be applied on the photo lithography processes of any features in the formation of integrated circuits.

In accordance with some embodiments, Anti-Reflective coating Layer (ARL) 22 is formed over target layer 20. ARL 22 may be a Nitrogen-Free ARL (NFARL), which may be formed of an oxide in some exemplary embodiments. For example, NFARL may include silicon oxide formed using Plasma Enhanced Chemical Vapor Deposition (PECVD). In alternative embodiments, ARL 22 is not formed. ARL 22 is sometimes referred to as a pad layer.

Mask layer 24 is formed over ARL 22 (if formed) and target layer 20. Mask layer 24 is referred to as hard mask layer 24 hereinafter. In some embodiments, hard mask layer 24 comprises a nitride such as silicon nitride, an oxide such as silicon oxide, an oxynitride such as silicon oxynitride, or the like. The thickness of hard mask layer 24 may be between about 20 Å and about 2,000 Å. It is appreciated, however, that the values recited throughout the description are merely examples, and may be changed to different values.

In accordance with some embodiments, ARL 26 is formed over hard mask layer 24. ARL 26 may also be an NFARL, which may be formed of an oxide, for example, silicon oxide formed using PECVD.

The subsequent process steps are illustrated in FIG. 1, and are described in in process flow 100 as shown in FIG. 1. Referring to FIG. 1, in step 102, mask layer 27 is applied over wafer 10 and etched. FIG. 3 illustrates the cross-sectional view of step 102 in accordance with some embodiments. In the illustrated embodiments, mask layer 27 includes a tri-layer, which includes under layer 28 (sometimes referred to as a bottom layer), middle layer 30 over under layer 28, and upper layer 32 over middle layer 30. In alternative embodiments, mask layer 27 may be a single-layer photo resist or a double-layer. In some embodiments, under layer 28 and upper layer 32 are formed of photo resists, which include organic materials. Under layer 28 may have a thickness between, for example, about 1,000 Å and about 2,000 Å. Middle layer 30 may include an inorganic material, which may be a nitride (such as silicon nitride), an oxynitride (such as silicon oxynitride), an oxide (such as silicon oxide), or the like. Middle layer 30 may also include the mix of silicon and an organic material. Middle layer 30 may have a thickness between, for example, about 300 Å and about 400 Å. Upper layer 32 may have a thickness between, for example, about 500 Å and about 700 Å. Middle layer 30 has a high etching selectivity relative to upper layer 32 and under layer 28, and hence upper layer 32 may be used as an etching mask for the patterning of middle layer 30, and middle layer 30 may be used as an etching mask for the patterning of under layer 28. After the application of upper layer 32, upper layer 32 is patterned.

Figure 4:
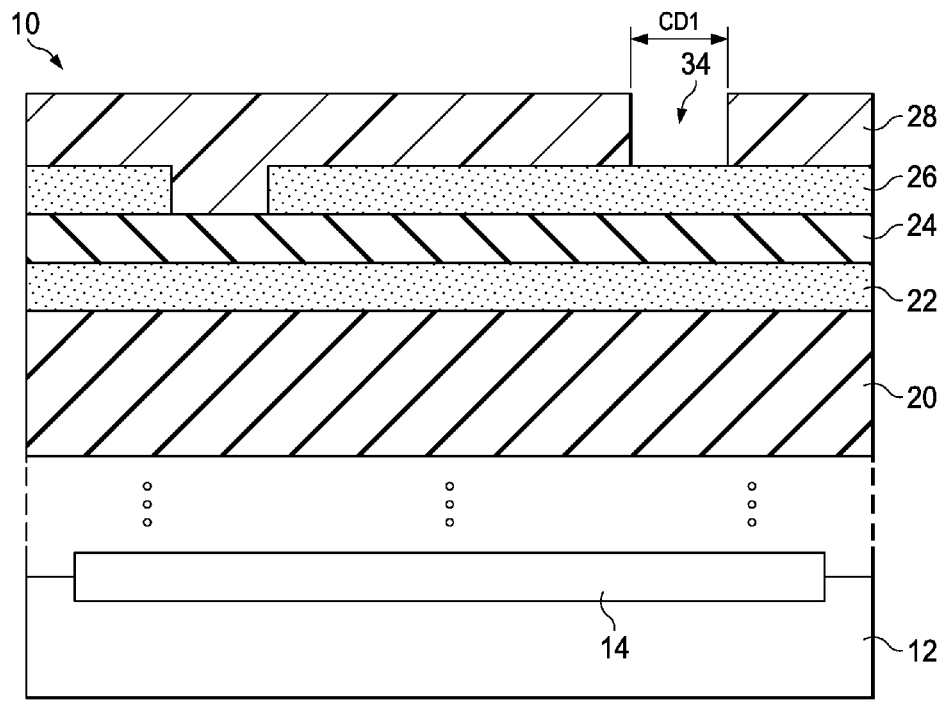

Next, as shown as step 104 in the process flow 100 in FIG. 1, the tri-layer in FIG. 3 is etched to form the structure in FIG. 4, wherein trench (opening) 34 is formed in under layer 28. The etching of the mask layer as shown by step 104 is referred to as a partial etch throughout the description, since the etching is not finished until step 112. In the partial etch, upper layer 32 is first light-exposed and developed. Middle layer 30 is then etched using the patterned upper layer 32 (FIG. 3) as an etching mask, so that the patterns in upper layer 32 are transferred to middle layer 30. During the patterning of middle layer 30, upper layer 32 is at least partially, or entirely, consumed. After middle layer 30 is etched through, under layer 28 is patterned, wherein middle layer 30 is used as an etching mask. Upper layer 32 will also be fully consumed during the patterning of under layer 28 if it has not been fully consumed in the patterning of middle layer 30.

Figure 2:
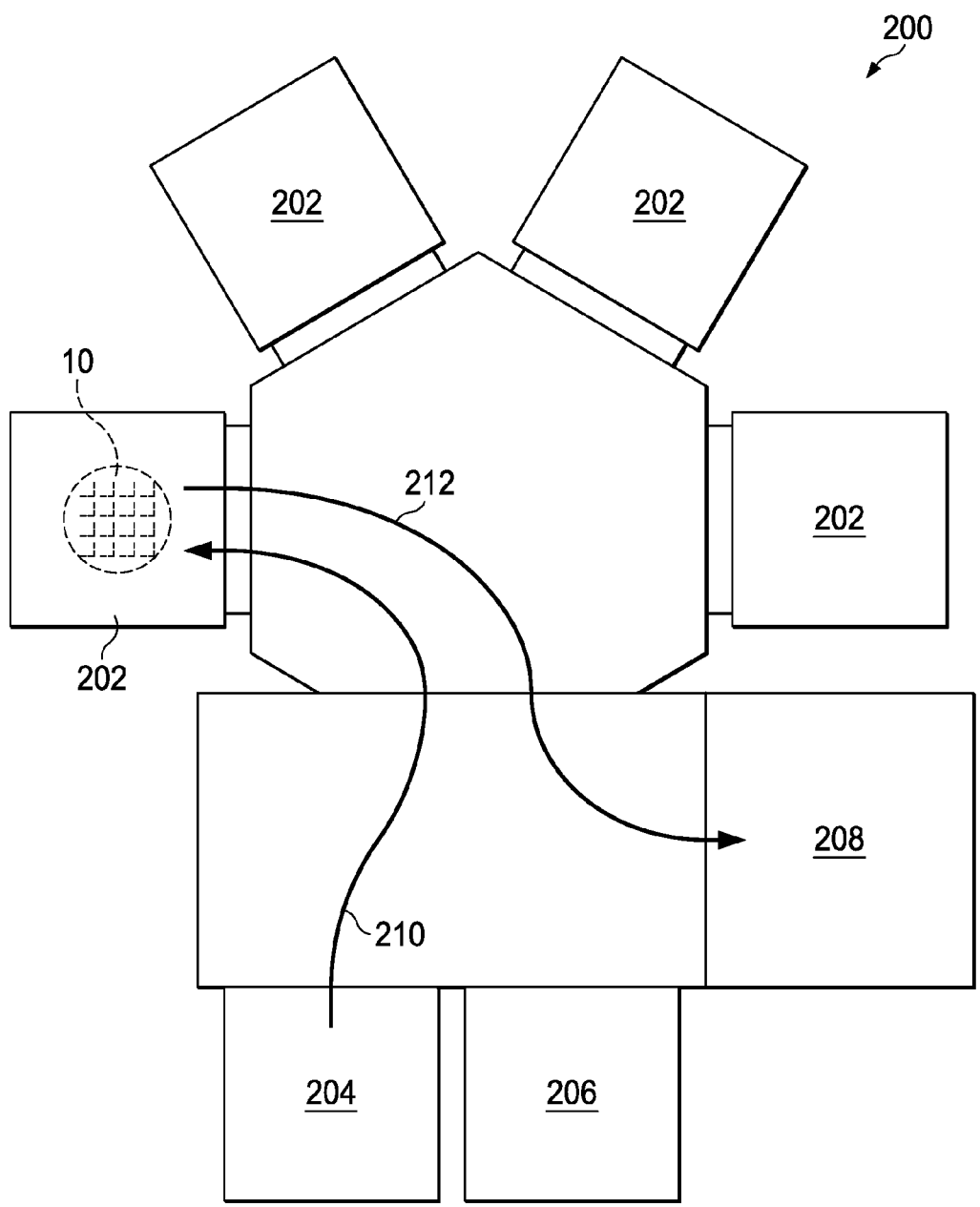
FIG. 2 illustrates an etching tool for performing etching and in-situ measurements in accordance with some embodiments.

Next, referring to step 106 in FIG. 1, the lateral size of trench 34 (FIG. 4) is measured. FIG. 2 illustrates an etching tool for performing the steps 104 and 106 (FIG. 1). Referring to FIG. 2, etching tool 200 may include one or a plurality of etching chambers 202, with each of etching chambers 202 configured to perform the etching of the tri-layer. Etching tool 200 further includes loading and unloading station (such as loadlocks) 204 and 206, through which wafer 10 is loaded into and out of etching tool 200. Furthermore, metrology tool 208 is integrated into etching tool 200. Metrology tool 208 is configured to measure the sizes (such as lengths and widths) of the features on wafers.

Metrology tool 208 may share the same vacuum environment with etching chambers 202. Accordingly, wafer 10 may be loaded into etching tool 200 through loading station 204 and loaded into one of etching chambers 202, as represented by arrow 210. In some exemplary embodiments, the etching of wafer 10 in chamber 202 results in the formation of the structure in FIG. 4. Next, wafer 10 (FIG. 4) is transferred from the respective etching chamber 202 into metrology tool 208, in which the sizes of trench 34 (FIG. 4) is measured. The transferring is represented by arrow 212. In the illustrated embodiments, the measured lateral size (a length or a width) of trench 34 is denoted as CD1. In some embodiments, size CD1 may be a critical dimension (which equal to the minimum width of gate electrodes of transistors), or may be any other size greater than the critical dimension.

Referring back to process flow 100 in FIG. 1, in step 108, the measured size CD1 is compared to the specification (spec) of the respective integrated circuits, which specifies the desirable range (referred to as CD-spec hereinafter) of the lateral size of trench 34. Difference (CD1−CD-spec) is thus determined. The measured size CD1 may be within or out of the specified range of the CD-spec. If the measure size CD1 is inside the CD-spec, then under layer 28 as in FIG. 4 is used directly to etch the underlying layers, including hard mask layer 24 and the overlying and underlying layers 22 and 26 (FIG. 4). The respective etching of hard mask layer 24 and the overlying and underlying layers 22 and 26 is shown as step 110 in FIG. 1.

Figure 5:
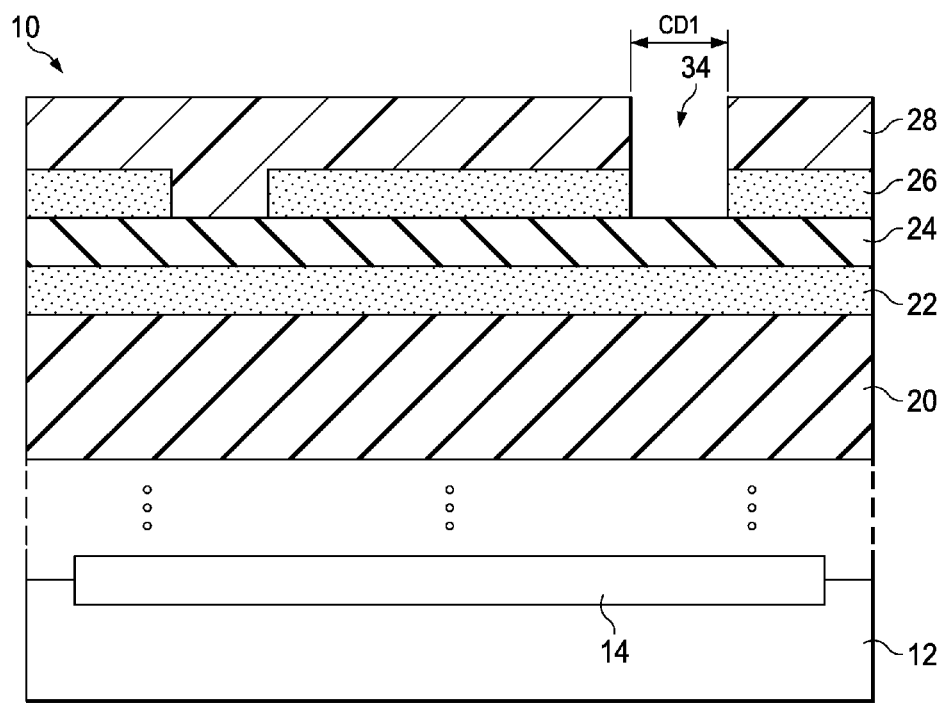
Figure 6:
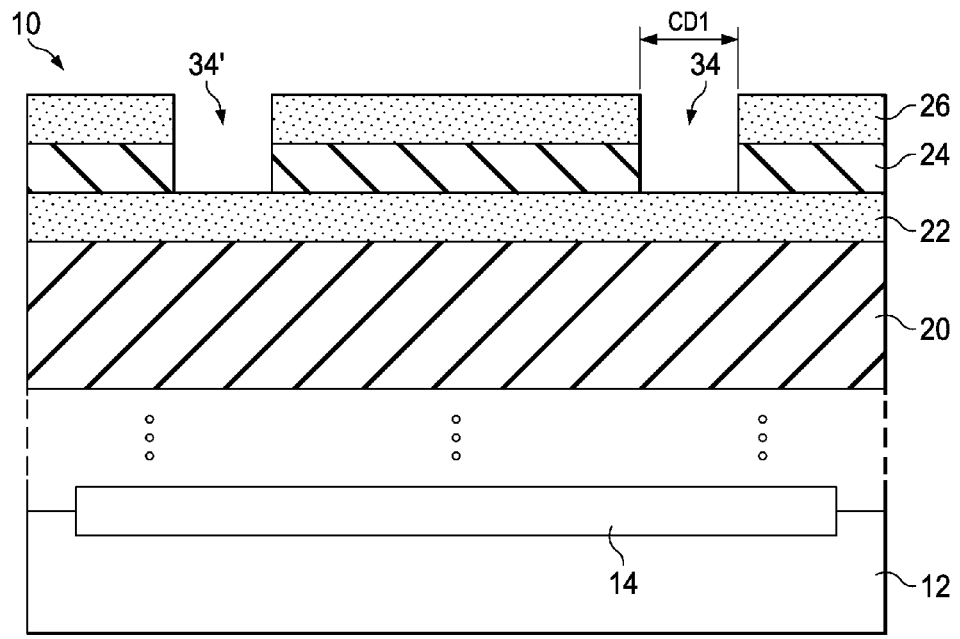

FIGS. 5 and 6 illustrate the etching of hard mask layer 24 and the overlying and underlying layers 22 and 26. In order to perform the steps in FIGS. 5 and 6, wafer 10 is transferred back to one of etching chambers 202 (FIG. 2). In these embodiments, as shown in FIG. 5, under layer 28 is used as the etching mask to etch/pattern NFARL 26 first. The etching is anisotropic, so that trench 34 extends into NFARL 26, with the lateral size of trench 34 substantially unchanged, and remains to be CD1.

FIG. 6 illustrates the removal of under layer 28 and the further etching of hard mask layer 24 using the patterned NFARL 26 as the etching mask. Under layer 28 may be fully consumed during or after the etching of NFARL 26, or may be removed after NFARL 26 is patterned. In addition, FIG. 6 also illustrates that trench 34' is exposed after NFARL 26 is removed. Trench 34' may be formed in a patterning process performed before the structure in FIG. 3 is formed, and may be formed in additional lithography and etching processes. Hench, the formation of trench 34' and trench 34 in combination may be a 2P2E (two photo two etching) process.

Figure 7:
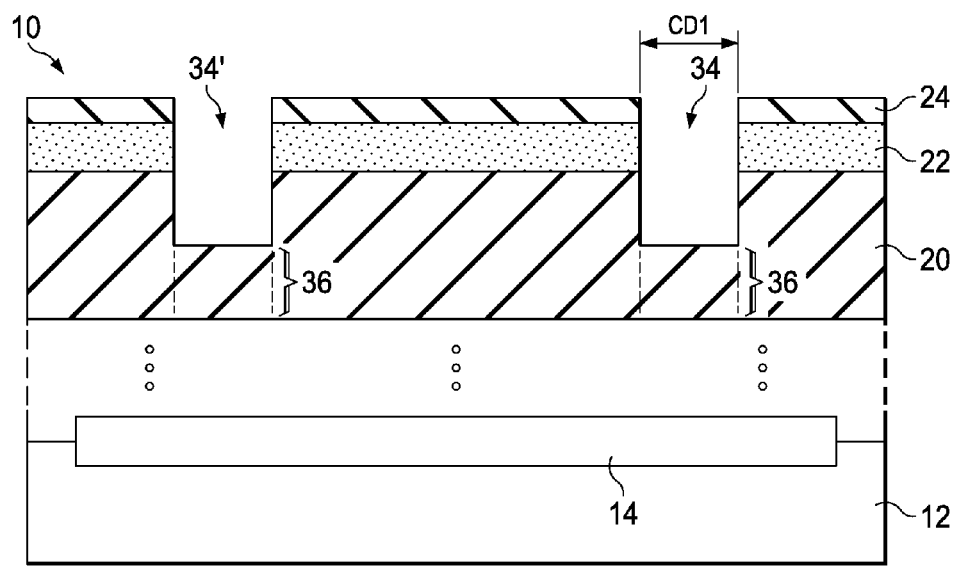

FIG. 7 illustrates the etching of target layer 20 using the patterned hard mask layer 24 as an etching mask. The respective process is illustrated as step 112 in FIG. 1. As shown in FIG. 7, due to the etching of target layer 20, trenches 34 and 34' extend into target layer 20. In accordance with some embodiments in which target layer 20 is a low-k dielectric layer, when trenches 34 and 34' are formed, via openings 36, which are pre-formed in target layer 20, also extend down simultaneously to penetrate through target layer 20.

Figure 8:
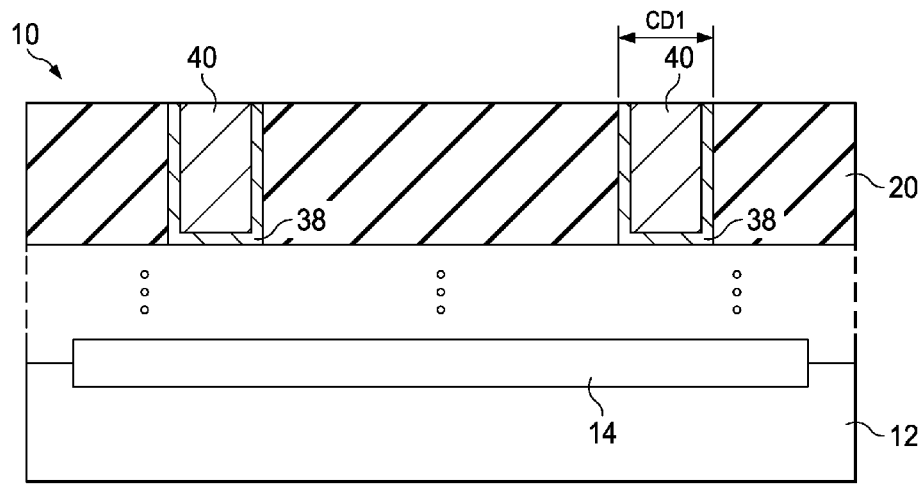

In the embodiments in which target layer 20 is a low-k dielectric layer, trenches 34 and 34' (and possibly the underlying via openings 36) as shown in FIG. 7 are filled with a metallic material, forming metal lines 38 and vias 40. The resulting structure is shown in FIG. 8. The formation process may include forming a diffusion barrier layer (such as titanium, titanium nitride, tantalum, or tantalum nitride), filling a copper-containing metal, and performing a planarization (such as Chemical Mechanical Polish (CMP)) to remove the excess metallic material. Hard mask layer 24 and NFARL 22 (FIG. 7) are also removed. As a result, as shown in FIG. 8, metal lines 38 and vias 40 are formed. Although FIG. 8 illustrates that metal lines 38 and vias 40 have the same width, if viewed in another vertical plane that is perpendicular to the illustrated plane shown in FIG. 8, metal lines 38 may be longer than vias 40.

Referring back to FIG. 1, if in step 108, it is determined that lateral size CD1 (FIG. 4) is out of the specified range CD-spec, compensation etch step 114 is performed to compensate for the difference (CD1−CD-spec). First, as shown in step 116, it is determined whether the measured lateral size CD1 is greater than or smaller than the specified range CD-spec. Next, if the measured lateral size CD1 is greater than the specified range CD-spec, compensation etch step 118 is performed. Conversely, if the measured lateral size CD1 is smaller than the specified range CD-spec, compensation etch step 120 is performed. The compensation etch steps 118 and 120 may also be performed in one of etching chambers 202 in FIG. 2. The partial etch (step 104), the measuring step (step 106) and the compensation etch (step 114) as shown in FIG. 1 may be in-situ performed in the same etching tool 200 (FIG. 2), with no vacuum break occurring between these steps. After the compensation etch, the rest of the processes in these embodiments are essentially the same as in the embodiments shown in steps 112. The rest of the steps are also shown in FIGS. 5 through 8.

Figure 9:
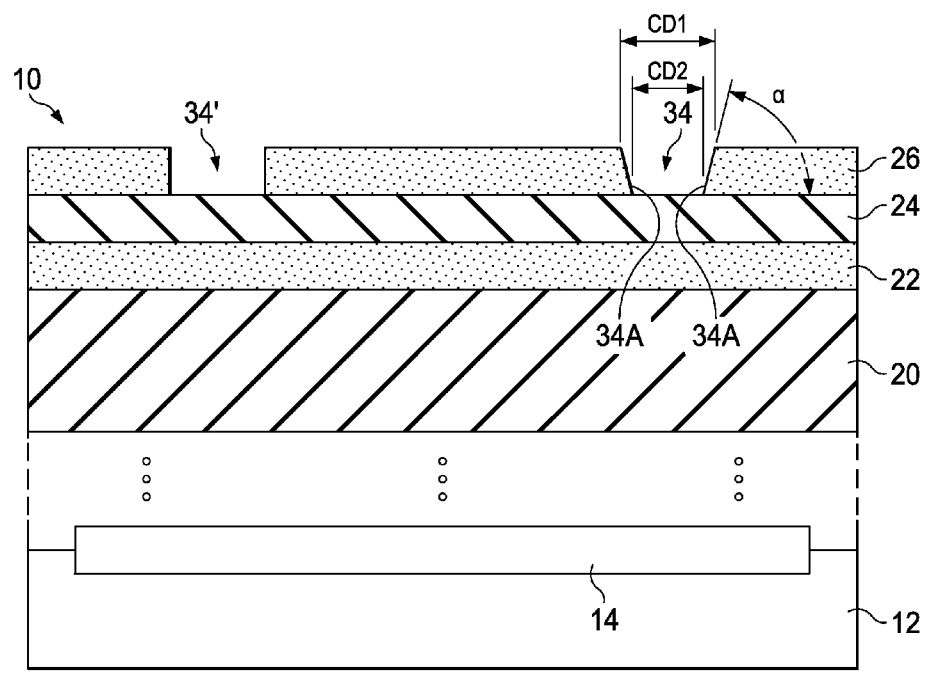
Figure 10:
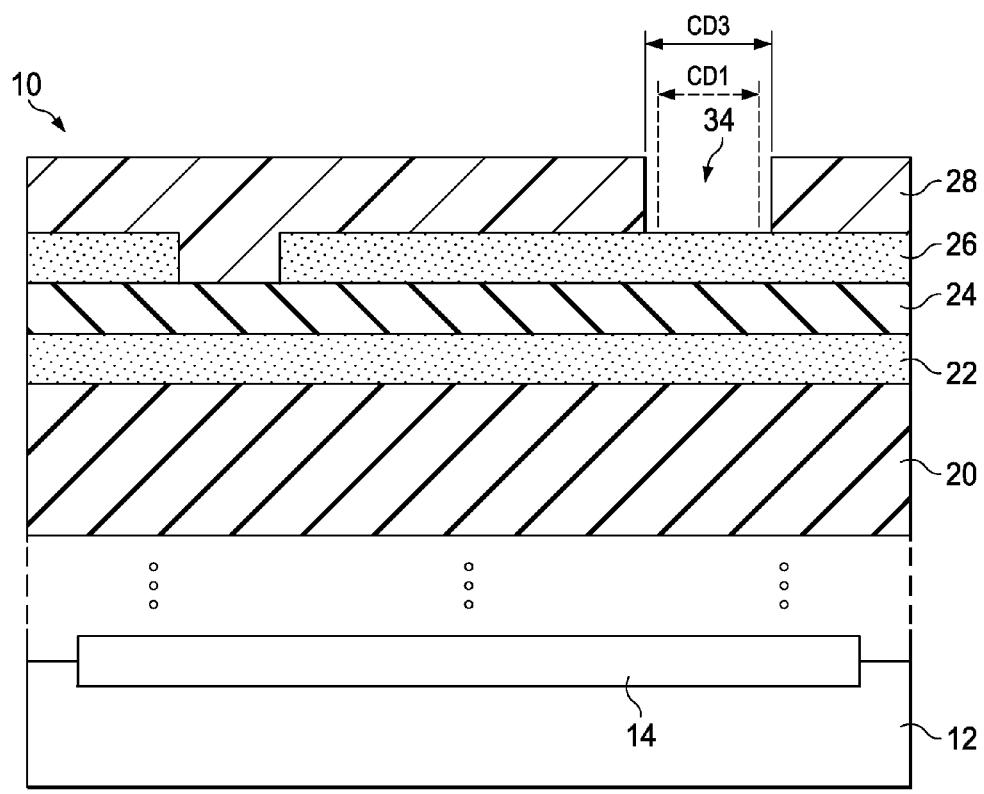

FIGS. 9 and 10 illustrate compensation etch steps 118 and 120 (FIG. 1), respectively. As discussed, when the measured lateral size CD1 is greater than the specified range CD-spec, the compensation etch as shown as step 118 (FIG. 1) is performed, and the respective cross-sectional view is shown in FIG. 9. In some exemplary embodiments, in the etch of NFARL 26 to extend trench 34 into NFARL 26, the etching process conditions are adjusted, so that trench 34 in NFARL 26 is tapered, and the sidewalls of trench 34 are slanted. This results in the bottom lateral size CD2 of trench 34 to be smaller than the lateral size CD1, which is the measured lateral size in under layer 28 (FIG. 4). For example, in order to achieve the tapered profile as shown in FIG. 9, the temperature of wafer 10 may be reduced in the etching process, so that sidewalls 34A of trench 34 are slanted. The desirable temperature is related to various factors. For example, assuming that when $CF_4$ or $CFH_3$ is used as the etching gas, trench 34 has vertical sidewalls when the temperature of wafer 10 is at a first temperature Temp1 in the range between about 38° C. and about 42° C. Accordingly, when tapered trench 34 is desired, the wafer temperature will be reduced to a second temperature Temp2 lower than the first temperature Temp1. In some experiments, it was found that difference (CD1−CD2) is a function of temperature difference (Temp1−Temp2), and the difference (CD1−CD2) may be close to 0.5*(Temp1−Temp2) in some embodiments, which means that every one degree (° C.) of temperature difference may cause a half nanometer of difference (CD1−CD2).

The slant angle α is related to the process conditions, and can be adjusted either. In some embodiments, slant angle α is smaller than 90 degrees and greater than about 60 degrees, and may be in the range between about 60 degrees and about 80 degrees. For example, the slant angle α is also related to the wafer temperature, and the lower the temperature is, the smaller the slant angle α.

Accordingly, by adjusting the etching conditions, the eventual bottom lateral size CD2 may be adjusted into desirable range CD-spec. Hence, when using NFARL to etch the underlying layers, size CD2, rather than CD1, will be transferred to the underlying layers, and the undesirably large size of trench 34 is compensated for.

Conversely, when the measured lateral size CD1 is smaller than the specified range CD-spec, the compensation etch as shown as step 120 (FIG. 1) is performed. The respective cross-sectional view is shown in FIG. 10. In these embodiments, instead of etching NFARL 26 directly, an additional etching process is performed to etch under layer 28 again in order to expand trench 34, so that the lateral dimension CD3 of the resulting trench 34 is greater than the original lateral dimension CD1. Furthermore, lateral dimension CD3 may fall into the specified range CD-spec. The etching of under layer 28 may be performed, for example, using an isotropic etching method. Alternatively, the etching of under layer 28 may be performed using an anisotropic etching method that also has an isotropic effect, so that a lateral etching effect results in the expansion of trench 34 laterally. The subsequent process steps (include step 112 in FIG. 1) are essentially the same as shown in FIGS. 5 through 8, and are not repeated herein.

By using the measurement step 106 (FIG. 1) and the compensation etch step 114 (FIGS. 1, 9, and 10), if the lateral size of trench 34 is out of specification, the compensation step may be used to compensate for the difference between the lateral size in of trench 34 and the specified range CD-spec. Accordingly, the deviation from the specified range CD-spec is corrected for the same wafer. This is advantageous over conventional feedback processes, in which the feedback takes effect to the subsequent wafers, while the deviation in the wafer that is found to be out of specification is not corrected.

Referring back to FIG. 1, the data (such as CD1 in FIG. 4) obtained from the step 106 is fed back to the etching (step 124) of a subsequent wafer (referred to as wafer 10' hereinafter, refer to FIG. 11). Wafer 10' may have a structure identical to wafer 10, and step 124 is the step corresponding to step 104, except that it is performed on wafer 10'.

Figure 11:
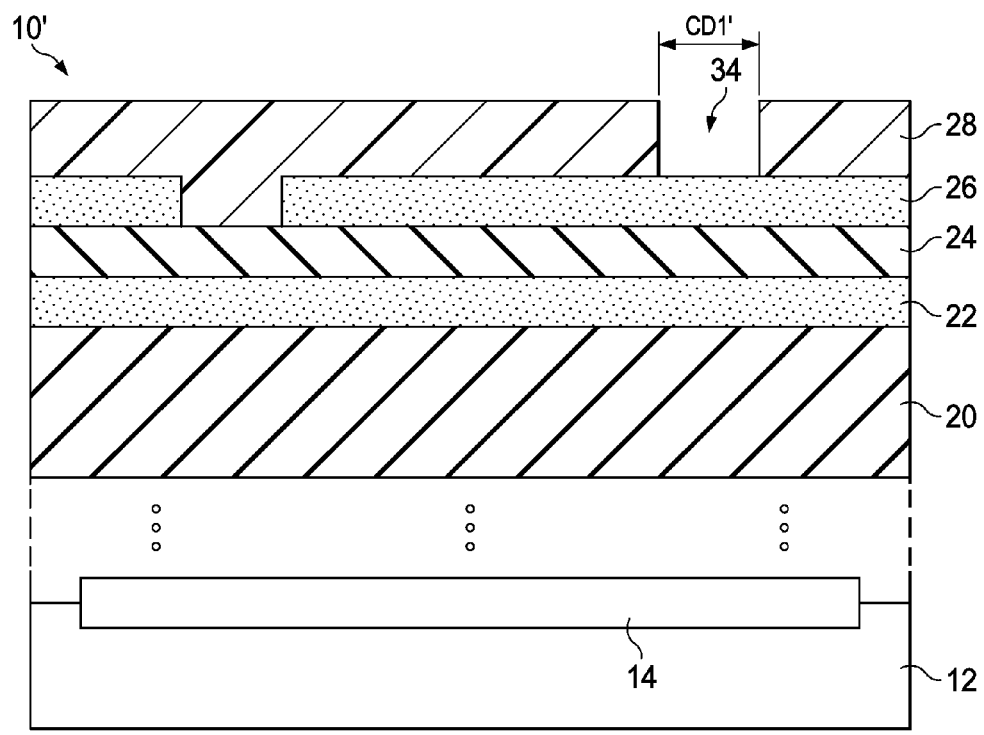

FIG. 11 illustrates the cross-sectional view of the exemplary wafer 10' after the etching of the respective tri-layer, wherein wafer 10' have gone through the steps as shown in FIGS. 3 and 4 already. For example, assuming that the lateral size CD1 of wafer 10 in FIG. 4 is greater than the CD-spec, then during the etching of under layer 28 in wafer 10', the lateral etching effect is reduced, so that the lateral size CD1' of wafer 10' (FIG. 10) is smaller than the lateral size CD1 of wafer 10 (FIG. 4). Conversely, if the lateral size CD1 of wafer 10 in FIG. 4 is greater than the CD-spec, then during the etching of under layer 28 in wafer 10', the lateral etching effect is increased, so that the lateral size CD1' of wafer 10' (FIG. 11) is greater than the lateral size CD1 of wafer 10 (FIG. 4). The reduction/increase of the lateral etching effect may be achieved, for example, by adjusting etching conditions used for etching the tri-layer. The amount of the adjustment is also determined by the difference (CD1−CD-spec). Through the adjustment, lateral size CD1' may be within the specified range CD-spec.

Referring to FIG. 1 again, after the etching step 124, process steps 106, 108, 110, 114, and 112 are repeated for wafer 10' (FIG. 10). Accordingly, wafer 10' has another chance of correcting the deviation in the size of the trench formed in target layer 20.

The process flow 100 as shown in FIG. 1 is briefly discussed blow. First, in step 104, a mask layer (for example, a photo resist) in a wafer is formed and etched to form openings, which have the patterns to be transferred to an underlying target layer. Next, the patterned mask layer is measured, as shown as step 106. If the sizes of the openings are within the specification, then the mask layer is used to etch an underlying hard mask layer, with the sizes in the mask layer transferred into the hard mask layer as they are, as shown as step 110. The hard mask layer is then used to etch the target layer, as shown as step 112. If the sizes of the openings are out of the specification, then a compensation etch is performed, so that the openings are formed in the hard mask layer and have the sizes within the specification, as shown as steps 118 and 120. In addition, the difference between the sizes of the openings in the mask layer and in the specification may be used to adjust the etching of the subsequent wafers.

The embodiments of the present disclosure have some advantageous features. By performing a measurement on the sizes of the openings/trenches after a partial etching in the photo resist (mask layer), which measurement is performed before the etching of the underlying hard mask layer, a compensation etch may be performed to correct the error in the photo resist when needed. Accordingly, the control of the sizes of features is improved. In addition, in conventional feedback mechanisms, the measurement of the sizes is performed after the hard mask layer is etched. Hence, the etching of the next wafer cannot be started before the hard mask layer of the previous wafer is finished. In the embodiments of the present application, however, the measurement is performed earlier, and hence the data obtained during the measurement may be fed back to the next wafer at an earlier stage. Alternatively stated, the etching of the next wafer may be started before the hard mask layer of the previous wafer is etched. This results in the improvement in the throughput of the etching process.

In accordance with some embodiments of the present disclosure, a method includes performing an etching on a mask layer to form an opening in the mask layer. The mask layer is a part of a wafer. The method further includes measuring a lateral size of the opening, comparing the lateral size of the opening with a specified range, and performing a compensation etch to compensate for a difference between the lateral size and the specified range. After the compensation etch, a target layer of the wafer is etched to extend the opening into the target layer.

In accordance with alternative embodiments of the present disclosure, a method includes providing a first wafer and a second wafer identical to each other. Each of the first wafer and the second wafer includes a target layer and a mask layer over the target layer, with the mask layer including a photo resist layer. The method further includes performing a first etching on the mask layer of the first wafer to form a first opening in the mask layer of the first wafer, measuring a lateral size of the first opening, comparing the lateral size of the first opening with a specified range in accordance with specification, and performing a second etching on the mask layer of the second wafer to form a second opening in the mask layer of the second wafer. The second etching is performed to compensate for a difference between the lateral size of the first opening and the specified range.

In accordance with yet alternative embodiments of the present disclosure, a method includes forming a hard mask layer over a target layer, forming an ARL over the hard mask layer, and forming a tri-layer over the ARL. The tri-layer includes an under layer, a middle layer over the under layer, and an upper layer over the middle layer. The method further includes etching the tri-layer to form an opening in the under layer, and measuring a lateral size of the opening in the under layer. After the lateral size is measured, the hard mask layer is etched to further extend the opening into the hard mask layer. The target layer is then etched using the hard mask layer as an etching mask. Subsequently, the opening is filled with a conductive material to form a metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    performing an etching on a photo resist to form a first opening in the photo resist, wherein the photo resist is in a first wafer;
    measuring a lateral size of the first opening;
    comparing the lateral size of the first opening with a specified range;
    determining a temperature for a compensation etch on an additional layer based on a difference between the lateral size and the specified range;
    performing compensation etch on the additional layer underlying the photo resist to compensate for a difference between the lateral size and the specified range and to make an additional lateral size of a second opening in the additional layer to fall into the specified range, wherein the second opening is extended from the first opening; and
    after the compensation etch, etching a target layer of the first wafer to extend the second opening into the target layer.

2. The method of claim 1, wherein the etching on the photo resist comprises etching an under layer of a tri-layer comprising the under layer, a middle layer, and an upper layer, with the under layer and the upper layer comprising photo resists, and wherein the measuring the lateral size comprises measuring the first opening in the under layer.

3. The method of claim 1, wherein the etching the target layer comprises etching a low-k dielectric layer.

4. The method of claim 1, wherein the lateral size of the first opening is greater than the specified range, wherein a bottom lateral dimension of the additional layer is within the specified range, and the method further comprises
    etching a hard mask layer underlying the additional layer, wherein the etching the target layer is performed using the hard mask layer as an etching mask.

5. The method of claim 1 further comprising:
    performing an additional etching on a mask layer of a second wafer to form a second opening in a mask layer of the second wafer, wherein the additional etching is performed with the difference compensated.

6. The method of claim 5 further comprising:
    measuring a lateral size of the second opening;
    comparing the lateral size of the second opening with the specified range;
    performing an additional compensation etch to compensate for an additional difference between the lateral size of the second opening and the specified range; and
    after the compensation etch, etching the target layer of the second wafer to extend the second opening into the target layer of the second wafer.

7. The method of claim 1, wherein the temperature is a function of the difference.

8. A method comprising:
forming a hard mask layer over a target layer;
forming an Anti-reflective Coating Layer (ARL) over the hard mask layer;
forming a tri-layer over the ARL, wherein the tri-layer comprises:
an under layer;
a middle layer over the under layer; and
an upper layer over the middle layer;
etching the tri-layer to form an opening in the under layer;
measuring a lateral size of the opening in the under layer;
comparing the lateral size with a specified range of the opening, wherein the lateral size is greater than the specified range;
determining a temperature for etching the ARL based on a difference between the lateral size and the specified range;
etching the ARL to extend the opening into the ARL, wherein the opening in the ARL has a tapered profile with a top lateral dimension and a bottom lateral dimension smaller than the top lateral dimension, and wherein process conditions of the etching the ARL is adjusted to the determined temperature to make the bottom lateral dimension fall into the specified range;
etching the hard mask layer using the ARL as an etching mask to extend the opening into the hard mask layer; and
etching the target layer using the hard mask layer as an etching mask.

9. The method of claim 8, wherein the etching the tri-layer, the measuring the lateral size, and the etching the target layer are in-situ performed in a same etching tool.

10. The method of claim 9, wherein no vacuum break occurs between the etching the tri-layer, the measuring the lateral size of the opening, and the etching the target layer.

11. The method of claim 8, wherein the target layer comprises a low-k dielectric layer.

12. A method comprising:
performing an etching on a photo resist to form a first opening in the photo resist, wherein the photo resist is in a first wafer;
measuring a lateral size of the first opening;
comparing the lateral size of the first opening with a specified range to determine a difference between the lateral size of the first opening and the specified range;
determining a first temperature that can result in vertical sidewalls for etching an Anti-reflective Coating Layer (ARL) underlying the photo resist to form a second opening in the ARL;
determining a second temperature based on the difference and the first temperature;
etching an Anti-reflective Coating Layer (ARL) at the second temperature to form the second opening in the ARL; and
etching a target layer of the first wafer to extend the second opening into the target layer.

13. The method of claim 12, wherein the difference between the lateral size of the first opening and the specified range is equal to 0.5 times a difference between the first temperature and the second temperature.

14. The method of claim 12, wherein the etching on the photo resist comprises etching an under layer of a tri-layer comprising the under layer, a middle layer, and an upper layer, with the under layer and the upper layer comprising photo resists, and wherein the measuring the lateral size comprises measuring the first opening in the under layer.

15. The method of claim 14, wherein the etching the target layer comprises etching a low-k dielectric layer.

16. The method of claim 12 further comprising:
performing an additional etching on a mask layer of a second wafer to form a second opening in a mask layer of the second wafer, wherein the additional etching is performed with the difference compensated for.

17. The method of claim 16 further comprising:
measuring a lateral size of the second opening;
comparing the lateral size of the second opening with the specified range;
performing a compensation etch to compensate for an additional difference between the lateral size of the second opening and the specified range; and
after the compensation etch, etching the target layer of the second wafer to extend the second opening into the target layer of the second wafer.

* * * * *